United States Patent
Mizuno et al.

(10) Patent No.: US 7,986,583 B2
(45) Date of Patent: Jul. 26, 2011

(54) METHOD FOR DESIGNING INTEGRATED CIRCUIT INCORPORATING MEMORY MACRO

(75) Inventors: Masaharu Mizuno, Kanagawa (JP); Masahiro Suzuki, Kanagawa (JP); Shinichi Uchino, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 187 days.

(21) Appl. No.: 12/379,041

(22) Filed: Feb. 11, 2009

(65) Prior Publication Data

US 2009/0201758 A1 Aug. 13, 2009

(30) Foreign Application Priority Data

Feb. 12, 2008 (JP) .................................. 2008-031006

(51) Int. Cl.
*G11C 8/00* (2006.01)
(52) U.S. Cl. ............ 365/233.1; 365/189.02; 365/230.02
(58) Field of Classification Search ................ 365/233.1, 365/189.02, 230.02
See application file for complete search history.

(56) References Cited

U.S. PATENT DOCUMENTS

| | | | |
|---|---|---|---|
| 5,422,858 A | 6/1995 | Mizukami et al. | |
| 5,568,437 A * | 10/1996 | Jamal | 365/201 |
| 6,058,056 A * | 5/2000 | Beffa et al. | 365/201 |
| 6,536,004 B2 * | 3/2003 | Pierce et al. | 714/719 |

FOREIGN PATENT DOCUMENTS

| | | |
|---|---|---|
| JP | 7-84987 | 3/1995 |
| JP | 2005-85344 | 3/2005 |

* cited by examiner

*Primary Examiner* — Pho M Luu
(74) *Attorney, Agent, or Firm* — McGinn IP Law Group, PLLC

(57) ABSTRACT

An integrated circuit design method whereby memory instances are assigned to memory macros integrated within an integrated circuit. A plurality of memory instances operating at the same operation frequency are assigned to a single memory macro. A frequency multiplier which receives a first clock signal is arranged to generate a second clock signal through frequency multiplication of the first clock signal, and feeds the second clock signal to the plurality of memory instances. A control circuit which selects the memory instances in synchronization is arranged with the first clock signal.

15 Claims, 12 Drawing Sheets

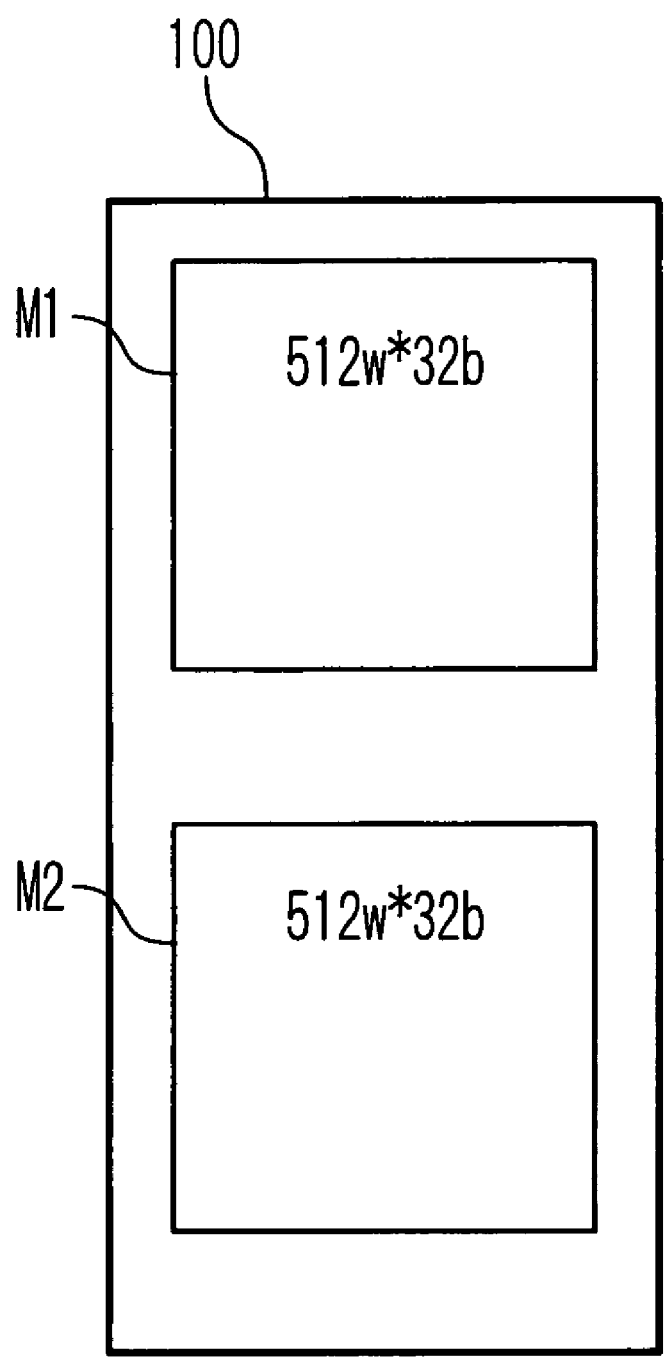

US 7,986,583 B2

METHOD FOR DESIGNING INTEGRATED CIRCUIT INCORPORATING MEMORY MACRO

INCORPORATION BY REFERENCE

This application claims the benefit of priority based on Japanese Patent Application No. 2008-031006, filed on Feb. 12, 2008, the disclosure of which is incorporated herein by reference.

BACKGROUND OF THE INVENTION

1. Field of the Invention

The present invention relates to integrated circuit design, more particularly, to a method for designing a semiconductor integrated circuit incorporating a memory macro.

2. Description of the Related Art

In designing structured ASICs (Application Specific Integrated Circuit) and FPGAs (Field Programmable Gate Array), limitations are imposed on the allowed maximum number of memory instances (memory regions used as memory arrays) integrated in an product integrated circuit, the allowed total maximum memory capacity (memory size) for the product integrated circuit and the allowed memory capacity of each memory instance are limited to predetermined values.

Conventionally, memory instances are usually assigned to memory macros in a one-to-one relationship, respectively, in the memory assignment of an ASIC, such as a cell base IC and a gate array. In addition, it is a well-known technique that a large memory macro is divided into a plurality of small memory macros, and the small memory macros are assigned to a plurality of memory instances with the small memory macros attached with peripheral circuits. According to this technique, the small memory macros are assigned to the memory instances, in a one-to-one relationship.

For an integrated circuit incorporating ten memory macros each having 512 word lines and 32 data lines, for example, only ten RAMs (random access memories) are allowed to be incorporated at a maximum, even when the capacity of each incorporated RAM is 512 words of 16 bits or less. In other words, the maximum number of memory instances allowed to be assigned is ten.

On the other hand, Japanese Laid Open Patent Application (JP-A 2005-085344) and Japanese Laid Open Patent Application (JP-A H07-084987) discloses integrated circuits in which a frequency-doubled clock is used to enhance the port number of the memory macros.

In the following, a description is given of an exemplary integrated circuit design for satisfying requests from the user, with reference to FIGS. 1, 2A and 2B, with an assumption that an integrated circuit product is designed in which two memory macros M1, M2 each having 512 word lines and 32 bit lines (such memory macros are referred to as 512 w*32 b memory macros, hereinafter) are integrated into a memory macro arrangement region 100 of the integrated circuit to be designed, as shown in FIG. 1.

In the conventional technique described above, only two memory instances are allowed to be assigned to the memory macros M1 and M2 in total, since only one memory instance is allowed to be assigned to one memory macro. In this case, three or more memory instances are not allowed be assigned to the two memory macros M1 and M2. Also, the memory size is predetermined for each memory macro. In the example of FIG. 1, the memory size of the memory macros M1 and M2 is 512 w*32 b, and a memory instance larger than this memory size is not allowed be assigned to the memory macros M1 and M2. It should be noted, however, that, when the memory macro M1 and/or M2 is allowed to be divided into two size-reduced memory macros with a size smaller than 512 w*32 b, the two size-reduced memory macros are allowed to be assigned to two memory instances I1 and I2.

On the other hand, the user often requests that memory macros of various configurations are integrated into the integrated circuit. No problem arises in a case when the user only requests a product with two 512 w*32 b memories. However, the user often requests that the product integrated circuit incorporates memories of memory sizes different from the predetermined value or that the number of memories integrated within the product integrated circuit is larger than the number of the memory macros. For example, the user may request the product integrated circuit to include the two 512 w*16 b memories. For such a request, as shown in FIG. 2A, memory instances I11 and I2 with 512 w*16 b are assigned to the memory macros M1 and M2, respectively. In this case, as shown in FIG. 2A, two 512 w*16 b regions, denoted by the numerals R1 and R2 in FIG. 2A, remain unused within the memory macros M1 and M2. That is, half of the total memory capacity of the product integrated circuit (here, 512 w*32 b) is not effectively used.

When the user requests a semiconductor integrated circuit incorporating the two 256 W*32 b memories as shown in FIG. 2B, on the other hand, 256 W*32 b memory instances I3 and I4 are assigned to the memory macros M1 and M2, respectively. This results in that two 256 W*32 b regions, denoted by the numerals R3 and R4 in FIG. 2B, remain unused in the memory macros M1 and M2, respectively. That is, similarly to the example shown in FIG. 2A, half of the total memory capacity of the integrated circuit to be designed is not effectively used.

As thus discussed, the conventional technique undesirably suffers from a drawback that the memory capacity of the overall integrated circuit is not efficiently used; parts of the memory macros, the total capacity of which is 512 w*32 b, for example, remain unused. Moreover, a memory instance can not to be added to the integrated circuit to be designed because of the lack of the memory macro, after memory instances are already assigned to all of the memory macros. For the case of the integrated circuit of FIG. 1, for example, the conventional art does not satisfy the use's requirement to add a third memory instance.

SUMMARY

In an aspect of the present invention, an integrated circuit design method is provided in which memory instances are assigned to memory macros integrated within an integrated circuit. The integrated circuit design method includes: assigning a plurality of memory instances operating at the same operation frequency to a single memory macro; arranging a frequency multiplier which receives a first clock signal to generate a second clock signal through frequency multiplication of the first clock signal, and feeds the second clock signal to the plurality of memory instances; and arranging a control circuit which selects the plurality of memory instances in synchronization with the first clock signal.

In another aspect of the present invention, a semiconductor integrated circuit is provided with a memory having a plurality of memory regions corresponding to a plurality of instances, respectively; a frequency multiplier receiving a first clock signal to generate a second clock signal through frequency multiplication of the first clock signal, and feeding the second clock signal to the plurality of memory instances;

and a control circuit which selects the plurality of memory instances in synchronization with the first clock signal.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 1 is a block diagram showing an exemplary configuration of a semiconductor integrated circuit incorporating memory macros within a memory macro arrangement region;

DESCRIPTION OF PREFERRED EMBODIMENTS

Figure 2A:
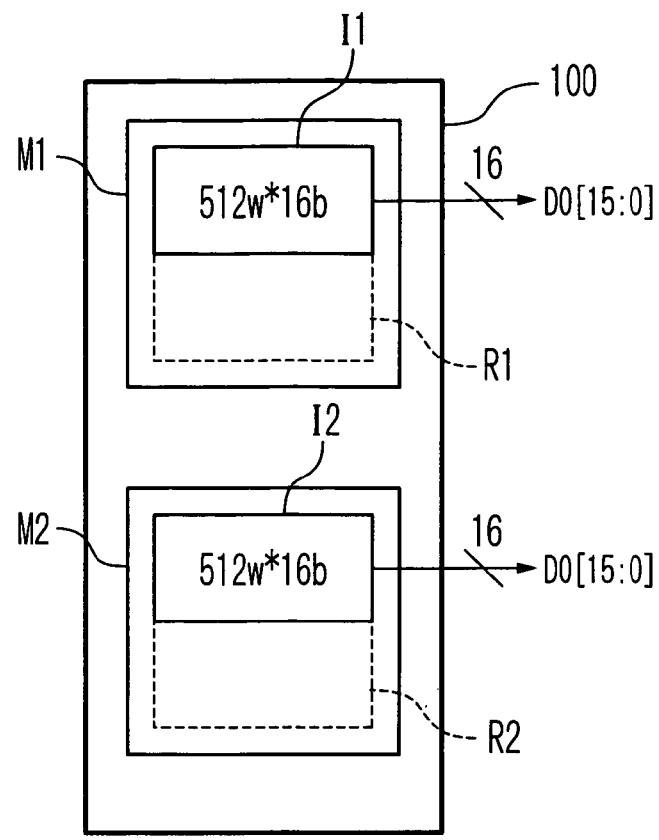
FIG. 2A is a block diagram showing one example of the memory assignment of a conventional technique in which memory instances are assigned to memory macros.
Figure 2B:
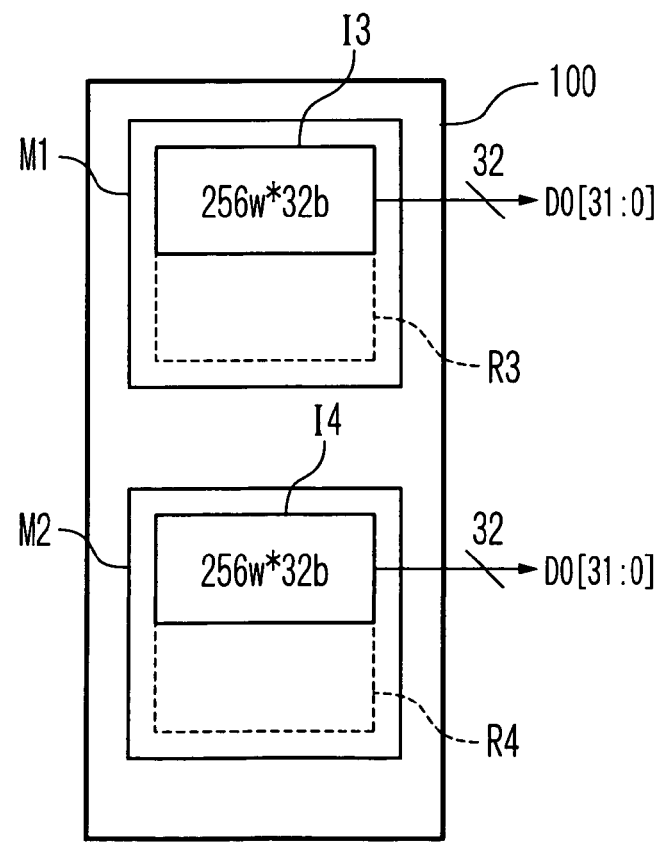
FIG. 2B is a block diagram showing another example of the memory assignment of a conventional technique in which memory instances are assigned to memory macros.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the following, a description is given of preferred embodiments of a semiconductor integrated circuit 1 and an integrated circuit design apparatus 10 according to the present invention with an assumption that the semiconductor integrated circuit 1; which is designed by the integrated circuit design apparatus 10, is a structured ASIC. It should be noted that the same or similar reference numerals denote the same, similar or equivalent components in the drawings.

Figure 3:
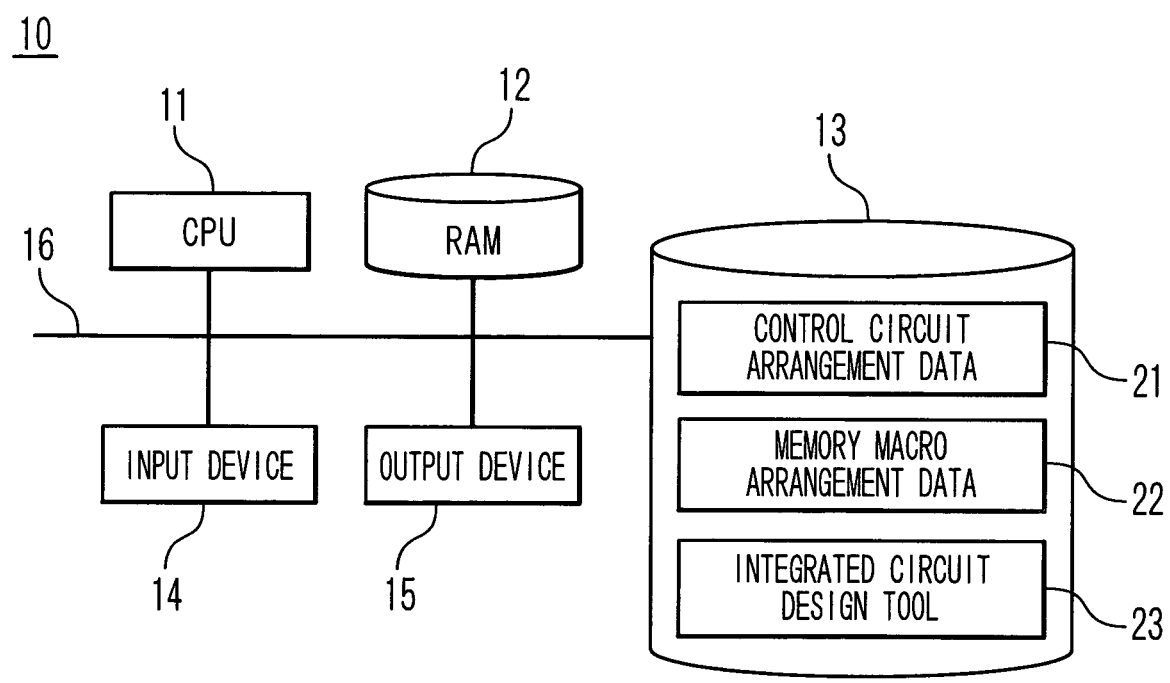
FIG. 3 shows an exemplary configuration of an integrated circuit design apparatus in one embodiment of the present invention.

FIG. 3 shows an exemplary configuration of the integrated circuit design apparatus 10 in one embodiment of the present invention. The integrated circuit design apparatus 10 is provided with a CPU (central processing unit) 11, a RAM (random access memory) 12, an external storage unit 13, an input device 14 and an output device 15, which are connected to each other through a bus 16. The external storage unit 13 may be a hard disc drive or a semiconductor memory device. The input device 14 is a man-machine interface used for a user to input various data into the integrated circuit design apparatus 10. The data inputted are stored in the storage unit 13. The input device 14 may include a keyboard and a mouse. The output device 15 visibly outputs the result of the circuit analysis obtained by the CPU 11 to the user. The output device 15 may include a monitor or a printer.

The CPU 11 executes program codes of an integrated circuit design program 23 installed onto the storage unit 13 in response to the user operation on the input device 14 to implement integrated circuit design processes, including the placement of memory macros. In the execution of the program codes, various data and program codes from the storage unit 13 are transiently stored in the RAM 12. The CPU 11 uses the data stored the RAM 12 to execute the program codes.

The storage unit 13 stores control circuit arrangement data 21, memory macro arrangement data 22, and the above-described integrated circuit design program 23. In one embodiment, a recording medium that stores the integrated circuit design program 23 may be used for installing the program 23 onto the storage unit 13. The control circuit arrangement data 21 includes the position data indicative of the positions of peripheral circuit macros and a peripheral apparatus region 110, and the control circuit arrangement data 21 are used to arrange the peripheral circuit macros, including an input control circuit 104 and an output control circuit 105, to be placed in the peripheral apparatus region 110. The input control circuit 104 and output control circuit 105 will be described later with reference to FIG. 4. The memory macro arrangement data 22 include position data indicative of the positions of a memory macro arrangement region 100 and memory macros incorporated therein, and the memory macro arrangement data 22 are used to arrange memory macros M1 and M2, such as a RAM macro, in the memory macro arrangement region 100.

The integrated circuit design program 23 has a function of assigning instances to the memory macro M1 integrated within the semiconductor integrated circuit 1, when executed by the CPU 11 in the integrated circuit design apparatus 10. The assignment of instances to memory macros is described in a hardware description language (HDL).

In the memory assignment implemented by the integrated circuit design apparatus 10 in this embodiment, multiple memory instances are allowed to be assigned to one memory macro. It should be noted that one memory instance is assigned to one memory macro in the conventional technique. The integrated circuit design apparatus 10 performs placement and routing for the memory macros M1, M2 and the peripheral circuit macros (a frequency multiplier 103, the input control circuit 104 and the output control circuit 105 shown in FIG. 4) so that multiple memory instances are assigned to one memory macro. In the following examples, a description is given of an exemplary design procedure of the semiconductor integrated circuit 1 in which the two memory instances are assigned to one memory macro.

Figure 4:
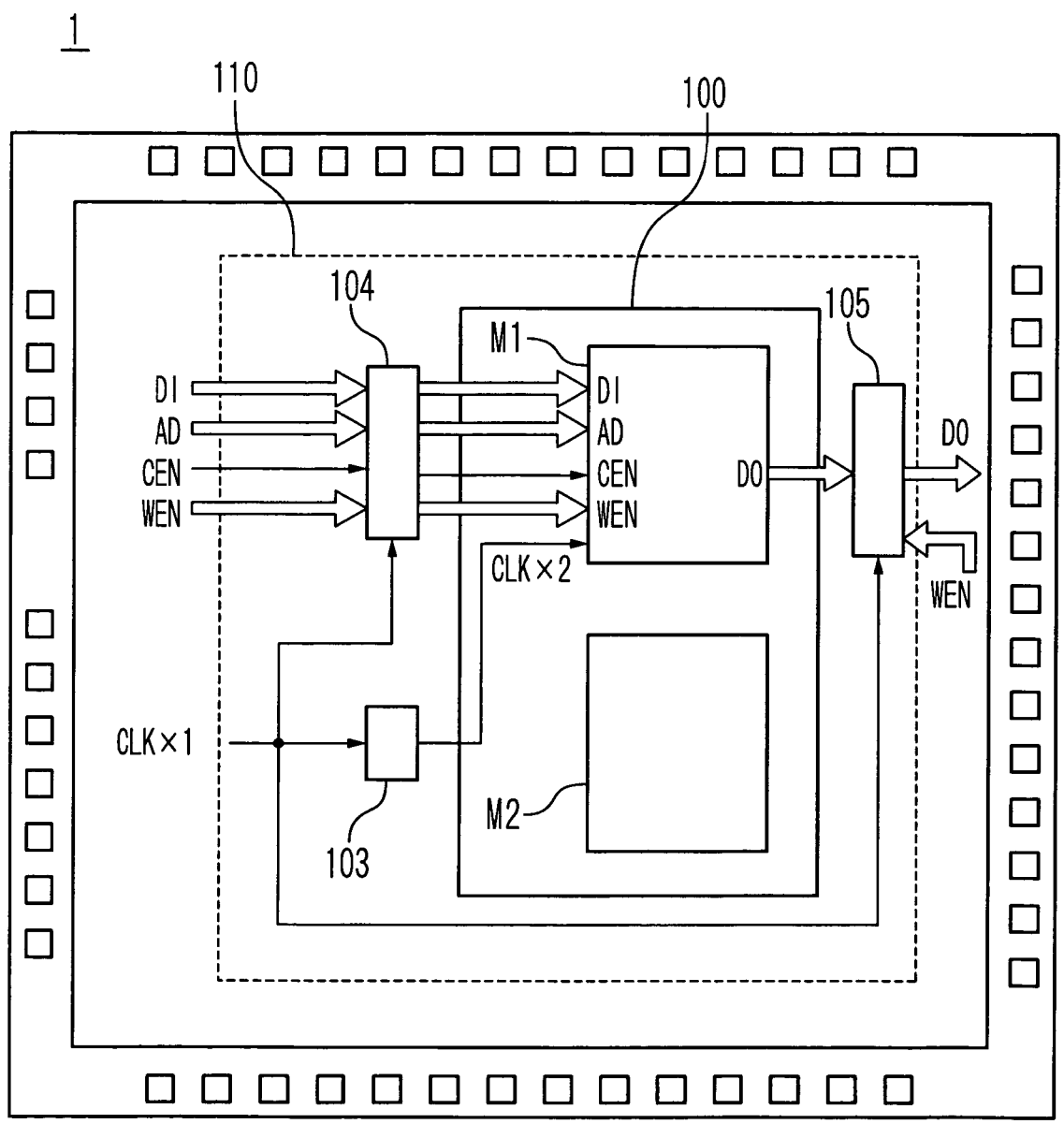
FIG. 4 is a floor plan diagram showing an exemplary configuration of a semiconductor integrated circuit designed by the integrated circuit design apparatus shown in FIG. 3.

FIG. 4 is a plan view of the semiconductor integrated circuit 1 designed by the integrated circuit design apparatus 10 in one embodiment of the present invention. The memory macro arrangement region 100 and the peripheral apparatus arrangement region 101 are defined in the semiconductor integrated circuit 1. The semiconductor integrated circuit 1 is integrated within a semiconductor substrate having contact pads in the peripheral area thereof. Memory macros M1 and M2 are arranged in the memory macro arrangement region 100. The frequency multiplier 103, the input control circuit 104 and the output control circuit 105 are arranged in the peripheral circuit arrangement region 110.

The frequency multiplier 103 performs frequency multiplication (for example, frequency doubling) on an input clock signal CLKx1 to generate a frequency-multiplied clock signal CLKx2, and feeds the clock signal CLKx2 to the memory macro M1. In the following, a description is given of a case where the clock signal CLKx2 is generated through frequency doubling of the clock signal CLKx1. In an alternative embodiment, the frequency multiplier 103 may be integrated within a region of the integrated circuit 1 other than the peripheral circuit arrangement region 110. In another alternative embodiment, an external clock signal having a frequency of twice of that of the clock signal CLKx1 may be received by a contact pad and used as the frequency-multiplied clock signal CLKx2 to be fed to the memory macro M1.

The input control circuit 104 selects data signals DI, address signals AD, chip selection signals CEN and command signals and feeds the selected signals to the memory instances assigned to the memory macro M1 in synchronization with the input clock signal CLKx1. In this embodiment, write enable signals WEN, which is generated in response to an issue of a write command, is fed as the command signals.

The memory macro M1, to which at least one memory instance is assigned, performs data write, read, and erasure operations in synchronization with the clock signal CLKx2, which is generated by the frequency multiplier 103. The data are written, read or erased in response to the data signals DI, the address signals AD, the chip selection signals CEN and the command signals, which are selectively fed to the respective memory instances from the input control circuit 104.

The output control circuit 105 controls the output cycle of data signals DO outputted from the memory macro M1 in response to the clock signal CLKx1 and the command signals (in this embodiment, the write enable signals WEN). The output control circuit 105 reads data from the memory macro M1 in synchronization with the clock signal CLKx2, and externally outputs the data read in synchronization with the clock signal CLKx1.

1. First Embodiment

In the following, a description is given of a first embodiment of the semiconductor integrated circuit 1 according to the present invention with reference to FIGS. 5 to 8. In this embodiment, memory macros M1 and M2 each having a memory size of 512 w*32 b are integrated within the memory macro arrangement region 100 of the semiconductor integrated circuit 1.

Figure 5:
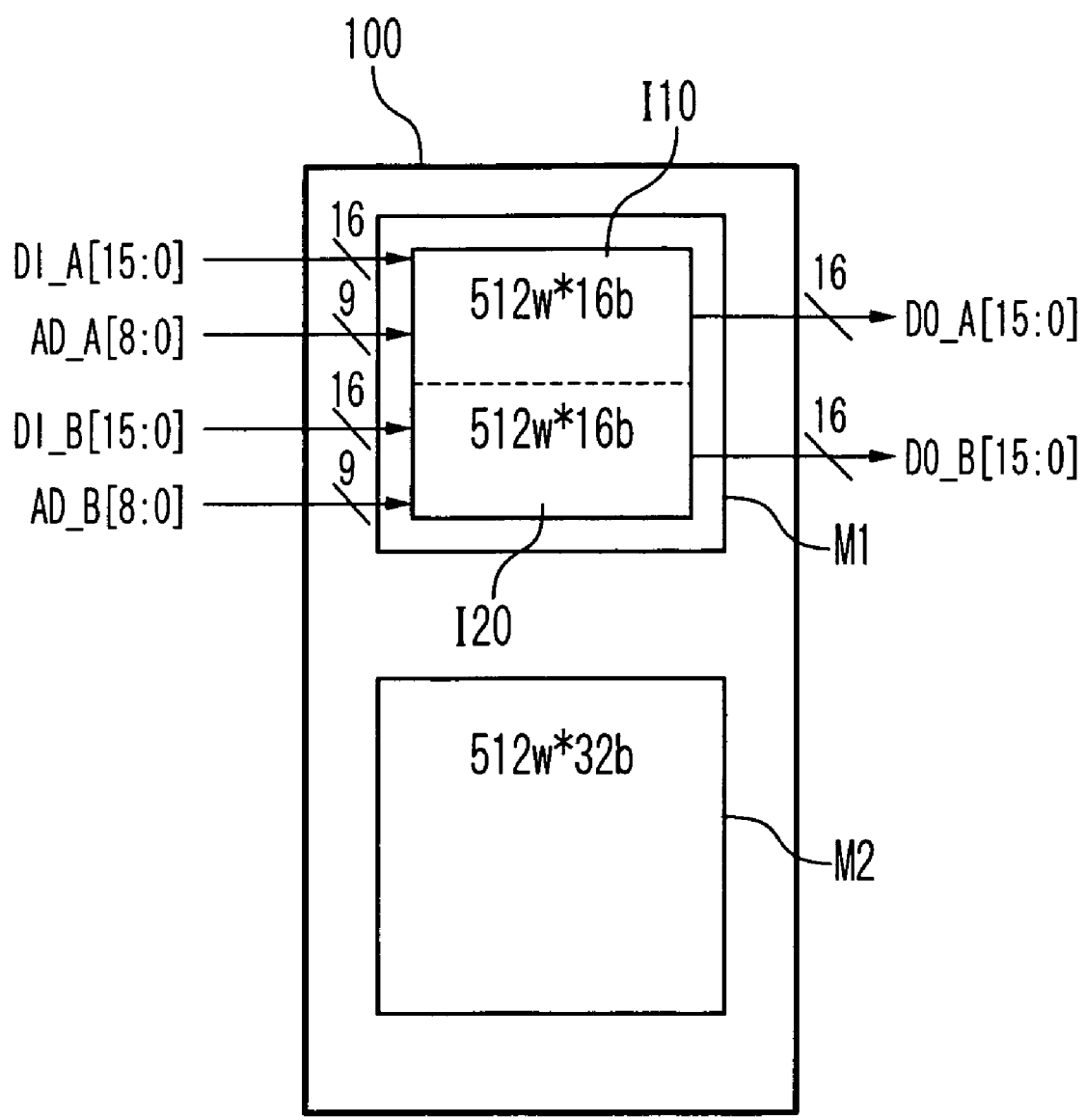
FIG. 5 is a conceptual view showing an exemplary memory assignment in which two memory instances are assigned to one memory macro in one embodiment of the present invention.

FIG. 5 is a conceptual view showing an exemplary memory assignment of the memory macros M1 and M2 integrated within the memory macro arrangement region 100. In this embodiment, two memory instances I10 and I20 each having the memory size of 512 w*16 b are assigned to the memory macro M1. The memory macro M1 contains a memory cell array with a memory size of 512 w*32 b, and the memory region corresponding to the upper 16 bits of the memory cell array is assigned to the memory instance I10, and the memory region corresponding to the lower 16 bits is assigned to the memory instance I20.

In the following, a description is given of the memory instances I10 and I20 assigned to the memory macro M1. Data signals DI_A [15:0] and address signals AD_A [8:0] are fed to the memory instance I10. The data signals DI_A [15:0] are fed to data input lines DI [15:0] corresponding to upper 16 bits of the memory macro M1 and written to the address specified by the address signals AD_A [8:0]. Furthermore, data signals DO_A [15:0] are read from the address specified by the address signals AD_A [8:0].

On the other hand, data signals DI_B [15:0] and address signals AD_B [8:0] are fed to the memory instance I20. The data signals DI_B [15:0] are inputted to data input lines DI [31:16] corresponding to the lower 16 bits of the memory macro M1 and written into the address specified by the address signals AD_B [8:0]. Furthermore, data signals DO_B [31:16] are read from the address specified by the address signal AD_B [8:0].

In the first embodiment, the address signals AD_A [8:0] and the address signals AD_B [8:0] are selected by the input control circuit 104, and the selected set of the address signals are fed to the memory macro M1. This allows selectively writing the data signal DI_A [15:0] or data signal DI_B [15:0] into the memory macro M1. In addition, the data signals DO_A [15:0] and the data signals DO_B [15:0] are selected by the output control circuit 105, and the selected set of the data signals are externally outputted to an external apparatus (not shown).

Figure 6:
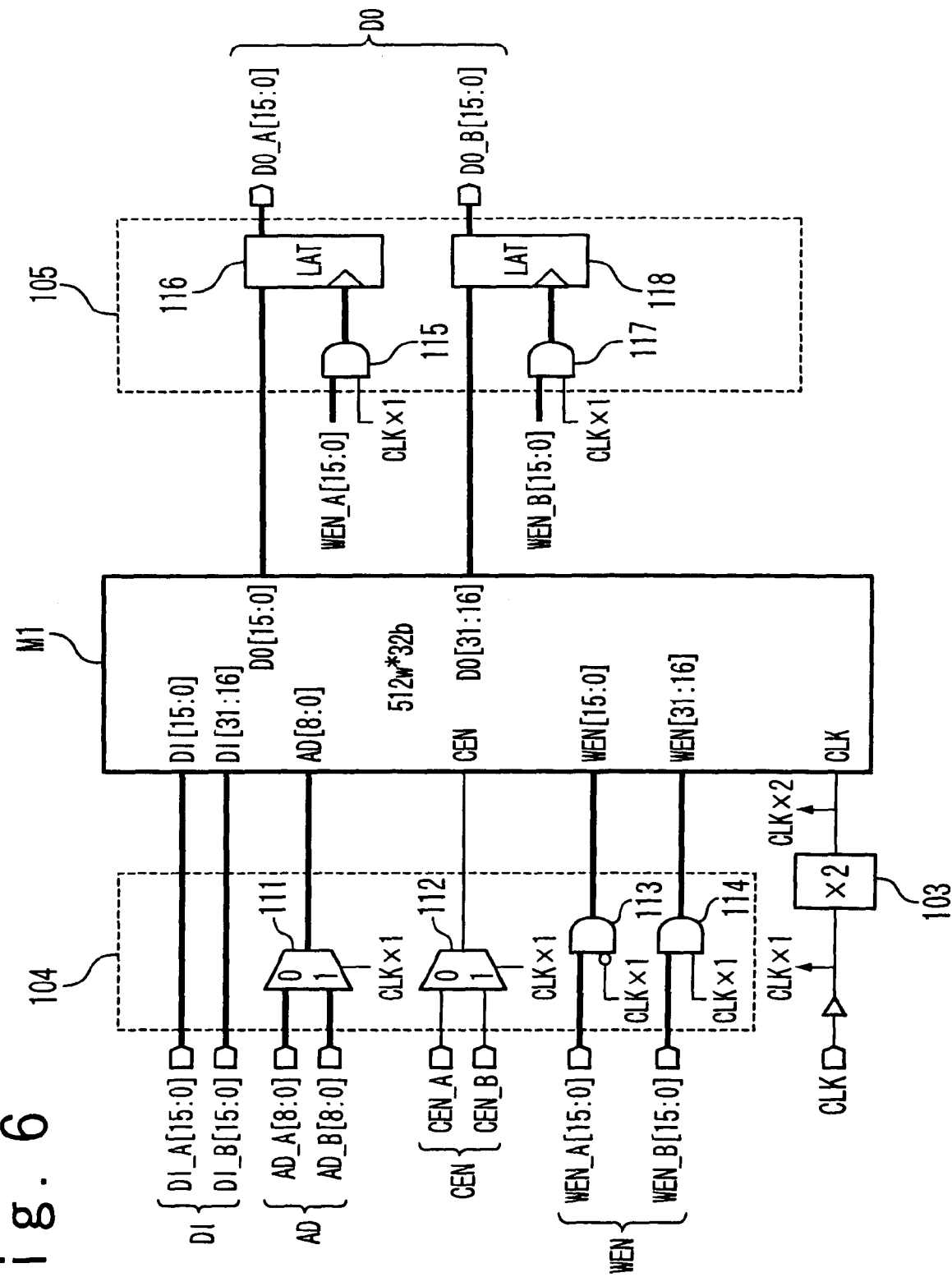
FIG. 6 is a block diagram illustrating exemplary configurations of a memory macro and a peripheral circuit macro designed by the semiconductor integrated circuit design apparatus of FIG. 3 in a first embodiment of the present invention.

As mentioned above, two memory instances: instances I10 and I20 are assigned to one memory macro M1 in this embodiment. FIG. 6 is a block diagram showing the detailed configurations of the memory macro M1 and the peripheral circuit macros (the frequency multiplier 103, the input control circuit 104 and the output control circuit 105) in the first embodiment. In the following, a detailed description is given of the configurations of the memory macro M1 and the peripheral circuit macros adapted to assign the two instances to one memory macro with reference to FIG. 6.

The input control circuit 104 includes selectors 111, 112 and AND circuits 113, 114. The data signals DI include: the data signals DI_A [15:0] fed to the data input lines DI [15:0] corresponding to the upper 16 bits; and the data signals DI_B [15:0] fed to the data input lines DI [31:16] corresponding to the lower 16 bits. The address signals AD include the address signals AD_A [8:0] and the address signals AD_B [8:0], which are fed to address signal lines AD [8:0] through the selector 111. The chip selection signals CEN include chip selection signals CEN_A and CEN_B, which are fed to a chip selection signal line CEN through the selector 112. The write enable signals WEN include: write enable signals WEN_A [15:0] which are fed to write enable signal lines WEN [15:0] corresponding to the upper 16 bits through the AND circuit 113; and write enable signals WEN_B [15:0] which are fed to write enable signal lines WEN [31:16] corresponding to the lower 16 bits.

The selector 111 selects the address signals AD_A [8:0] or the address signal AD_B [8:0] in response to the clock signal CLKx1, and outputs the selected address signals to the address signal lines AD [8:0] in the memory macro M1. In detail, the selector 111 selects the address signals AD_B [8:0] in response to the pull-up of the clock signal CLKx1 and selects the address signal AD_A [8:0] in response to the pull-down of the clock signal CLKx1.

The selector 112 selects the chip selector signal CEN_A, which selects the memory instance I10, and a chip selector signal CEN_B, which selects the memory instance I20, in response to the clock signal CLKx1 and outputs the selected one to the chip selection signal line CEN in the memory macro M1. In detail, the selector 112 selects the chip selector signal CEN_B in response to the pull-up of the clock signal CLKx1 and selects the chip selection signal CEN_A in response to the pull-down of the clock signal CLKx1.

The AND circuit 113 generates an output signal indicative of logical ANDs of the write enable signals WEN_A [15:0] corresponding to the memory instance I10 and the inversion signal of the clock signal CLKx1, and feeds the resultant output signals to the write enable signal lines WEN [15:0], which correspond to the upper 16 bits of the memory macro M1.

The AND circuit 114 generates an output signal indicative of the logical ANDs of the write enable signals WEN_B [15:0] corresponding to the memory instance I20 and the clock signal CLKx1, and feeds the resultant output signals to the write enable signal lines WEN [31:16], which correspond to the lower 16 bits of the memory macro M1.

The frequency multiplier 103 feeds the clock signal CLKx2, which is generated by the frequency-frequency doubling of the clock signal CLKx1 fed thereto, to the clock input CLK of the memory macro M1.

The output control circuit 105 includes AND circuits 115, 117 and latch circuits 116, 118. The latch circuit 116 has a clock input connected to the AND circuit 115 and data inputs connected to the data output signal lines DO [15:0], which correspond to the upper 16 bits of the memory macro M1. The latch circuit 116 latches the data signals DO_A [15:0] from the data output signal line DO [15:0] in response to the output from the AND circuit 115, namely, the logical AND between the write enable signal WEN_A [15:0] and the clock signal CLKx1. In order to surely latch the data from the memory macro M1, a delay circuit may be inserted between the AND circuit 115 and the latch circuit 116.

The latch circuit 118 has a clock input connected to the AND circuit 117 and data inputs connected to the data output signal lines DO [31:16], which correspond to the lower 16 bits of the memory macro M1. The latch circuit 118 latches the data signals DO_B [15:0] from the data output signal lines DO [31:16] in response to the output from the AND circuit 117, namely, the logical ANDs between the enable signals WEN_B [15:0] and the clock signal CLKx1. Also, in order to surely latch the data read from the memory macro M1, a delay circuit may be inserted between the AND circuit 117 and the latch circuit 118.

As described above, the memory instance I10 are configured to write and read data through the data input lines DI [15:0] and the data output signal lines DO [15:0], which correspond to the upper 16 bits of the memory macro M1. On the other hand, the memory instance I20 are configured to write and read data through the data input lines DI [31:16] and the data output signal lines DO [31:16], which correspond to the lower 16 bits of the memory macro M1. Also, the memory instances I10 and I20 alternately use the common address signal lines AD [8:0] in synchronization with the clock signal CLKx1. The data write and read to and from the memory macro M1 are carried out in synchronization with the frequency-multiplied clock signal CLKx2.

In a write operation, the data signals DI are alternately written to the memory instances I10 and I20 integrated within the memory macro M1 in synchronization with the clock signal CLKx2. Also, the data stored in the memory instances I10 and I20 are alternately outputted in synchronization with the frequency-multiplied clock signal CLKx2, and alternately read from the output control circuit 105 in synchronization with the clock signal CLKx1. The detailed operations of the memory macro M1 and peripheral circuit macros shown in FIG. 6 will be described below with reference to FIGS. 7 and 8.

Figure 7:
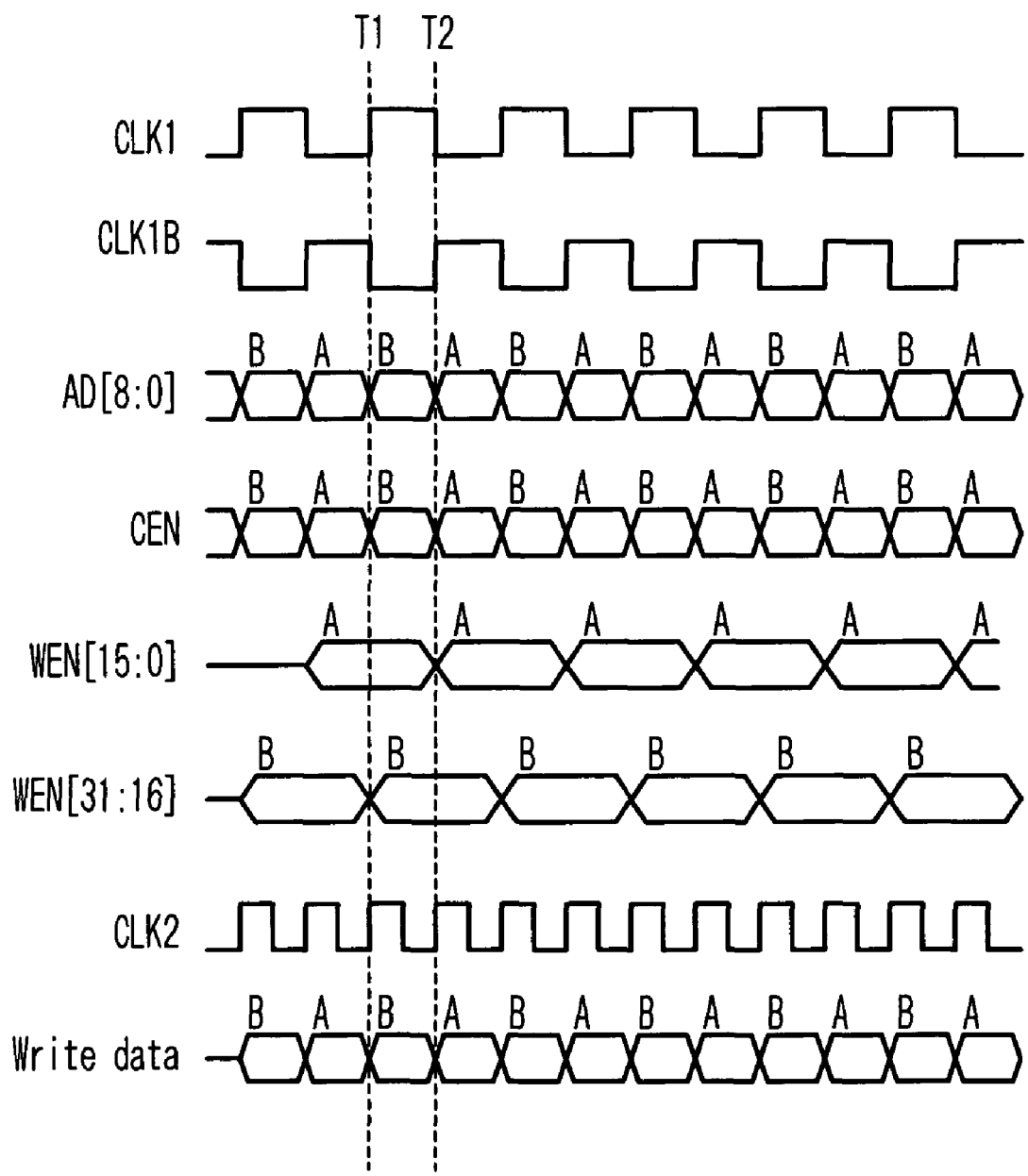
FIG. 7 is a timing chart showing an exemplary write operation of the memory macro and the peripheral circuit macro in the first embodiment.

FIG. 7 is a timing chart showing an exemplary write operation to the memory macro M1 in the first embodiment. In the example of FIG. 7, the clock signal CLKx1 is pulled up at the time T1 and pulled down at the time T2.

At the time T1, the chip selection signal CEN_B and the address signals AD_B [8:0] are selected and fed to the memory macro M1 in synchronization with the pull-up of the clock signal CLKx1. As a result, a desired address of the memory instance I20 is activated. In the meantime, the memory instance I20 is set writable by the write enable signals WEN_B [15:0] fed to the write enable signal lines WEN [31:16], which corresponds to the lower 16 bits.

At the time T2, the chip selection signal CEN_A and the address signals AD_A [8:0] are fed to the memory macro M1 in synchronization with the pull-up of the clock signal CLKx2. Thus, a desired address of the memory instance I10 is activated. In the mean time, the memory instance I10 is set writable by the write enable signals WEN_A [15:0] inputted to the write enable signal lines WEN [15:0], which corresponds to the higher 16 bits.

In the memory macro M1, the data signals DI fed to the data input lines DI [15:0] and those fed to the data input lines DI [31:16] are alternately written in synchronization with the frequency-multiplied clock signal CLKx2. Here, the data input lines DI [31:16] are set writable in synchronization with the pull-up of the clock signal CLKx2 and the data signals DI_B [15:0] fed to the data input lines DI [31:16] are written into the memory instance I20 at the time T1. Also, the data input lines DI [15:0] are set writable in synchronization with the pull-down of the clock signal CLKx2, and the data signals DI_A [15:0] fed to the data input lines DI [15:0] are written into the memory instance I10 at the time T2.

As mentioned above, the write data are alternately written into the memory instances I10 and I20, in synchronization with the clock signal CLKx2.

Figure 8:
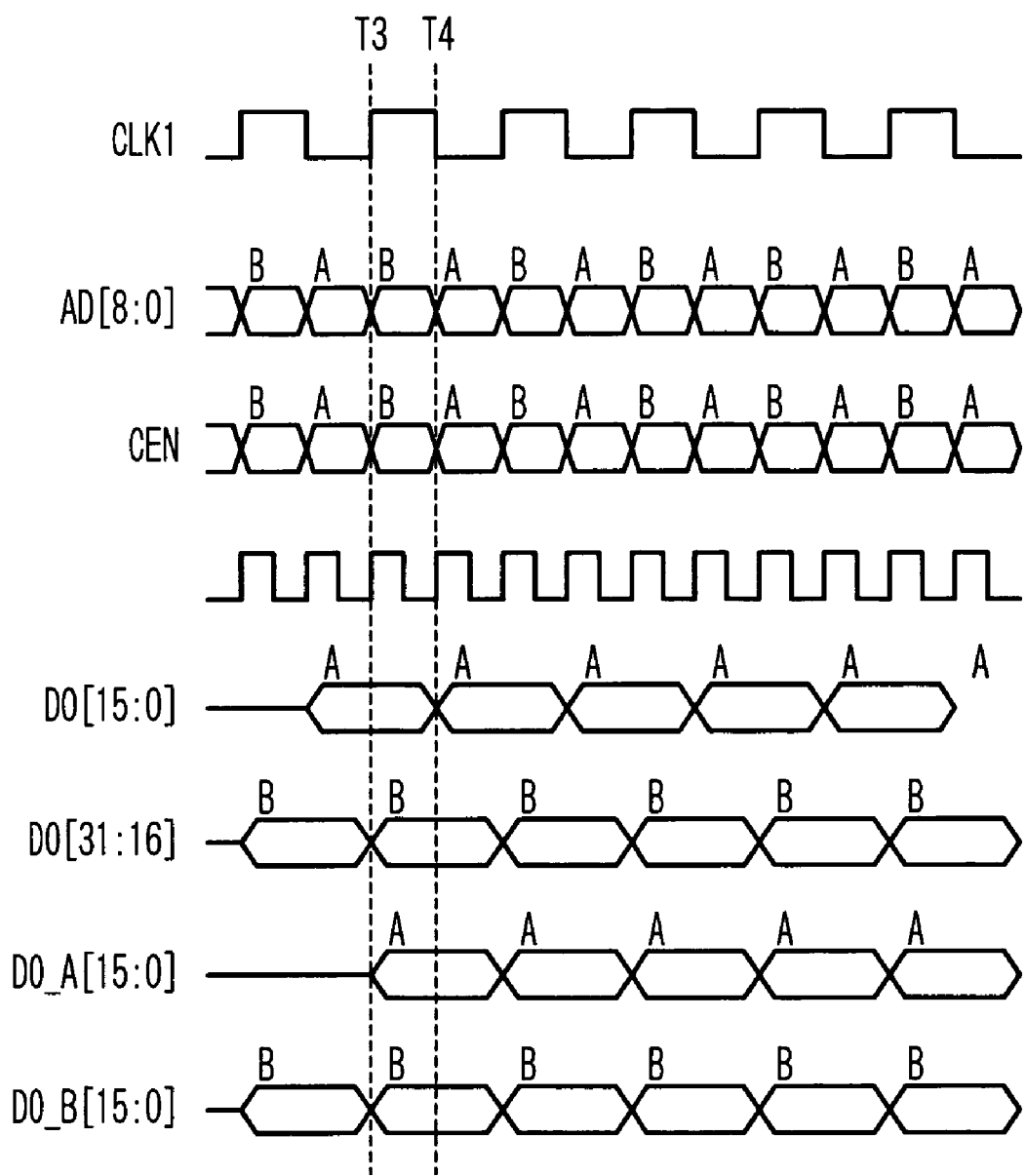
FIG. 8 is a timing chart showing an exemplary read operation of the memory macro and the peripheral circuit macro in the first embodiment.

FIG. 8 is a timing chart showing an exemplary read operation from the memory macro M1. A detailed description is given of the read operation from the memory macro M1 in the following with reference to FIG. 8.

In the example of FIG. 8, the clock signal CLKx1 is pulled up at the time T3 and pulled down at the time T4.

At the time T3, the chip selection signal CEN_B and the address signal AD_B [8:0] are fed to the memory macro M1 in response to the pull-up of the clock signal CLKx1. As a result, a desired address of the memory instance I20 is activated. In the meantime, the memory instance I20 is set readable by the write enable signal WEN_B [15:0] fed to the write enable signal line WEN [31:16], which correspond to the lower 16 bits.

At the time T4, the chip selection signal CEN_A and the address signal AD_A [8:0] are fed to the memory macro M1 in response to the pull-down of the clock signal CLKx1. As a result, a desired address of the memory instance I10 is activated. In the meantime, the memory instance I10 is set readable by the write enable signals WEN_A [15:0] fed to the write enable signal lines WEN [15:0], which correspond to the upper 16 bits.

Desired data are then alternately read from the data output signal lines DO [15:0] and DO [31:16] of the memory macro M1 in synchronization with the frequency-multiplied clock signal CLKx2. More specifically, the data output signal lines DO [31:16] are selected in synchronization with the pull-up of the clock signal CLKx2 at the time T2, and the data stored in the memory instance I20 (that is, the data signals DO_B [15:0]) are outputted from the data output signal lines DO [31:16]. Also, the data output signal lines DO [15:0] are selected in synchronization with the pull-down of the clock signal CLKx2 at the time T4, and the data stored in the memory instance 110 (that is, the data signals DO_A [15:0]) are outputted from the data output signal lines DO [15:0].

At the time T3, the latch circuit 118 latches the data signals DO_B [15:0] from the data output signal lines DO [31:16] in response to the pull-up of the output of the AND circuit 117 (namely, the clock signal CLKx1), and outputs the data signals DO_B [15:0] to an external apparatus (not shown). Correspondingly, at the time T4, the latch circuit 116 latches the data signals DO_A [15:0] from the data output signal lines DO [15:0] in response to the pull-down of the output of the AND circuit 115 (namely, the clock signal CLKx1), and outputs the data signals DO_A [15:0] to the external apparatus (not shown).

As mentioned above, the read data alternately read from the memory instances I10 and I20 in synchronization with the clock signal CLKx2 are outputted from the output control circuit 105 to the external apparatus (not shown) in synchronization with the clock signal CLKx1.

As thus described, the use of the selection circuit (input control circuit 104) for selecting the memory instance to be activated in response to the clock signal CLKx1, and the memory macro M1 operated in response to the frequency-multiplied clock signal CLKx2 allows assigning multiple instances to the same memory macro.

In the first embodiment, as shown in FIG. 5, the two memory instances I10 and I20, each of which has a capacity of 512 w*16 b, are allowed to be assigned to the same memory macro M1 (512 w*32 b). This allows using the entire memory macro M2 (512 w*32 b). Hence, the memory assignment of the first embodiment achieves the efficient assignment of instances to memory macros.

2. Second Embodiment

In the following, a description is given of the semiconductor integrated circuit 1 of a second embodiment according to the present invention, with reference to FIGS. 9 to 12. The integrated circuit 1 of this embodiment includes the memory macro arrangement region 100 incorporating memory macros M1 and M2, each having a memory size of 512 w*32 b, similarly to the first embodiment.

Figure 9:
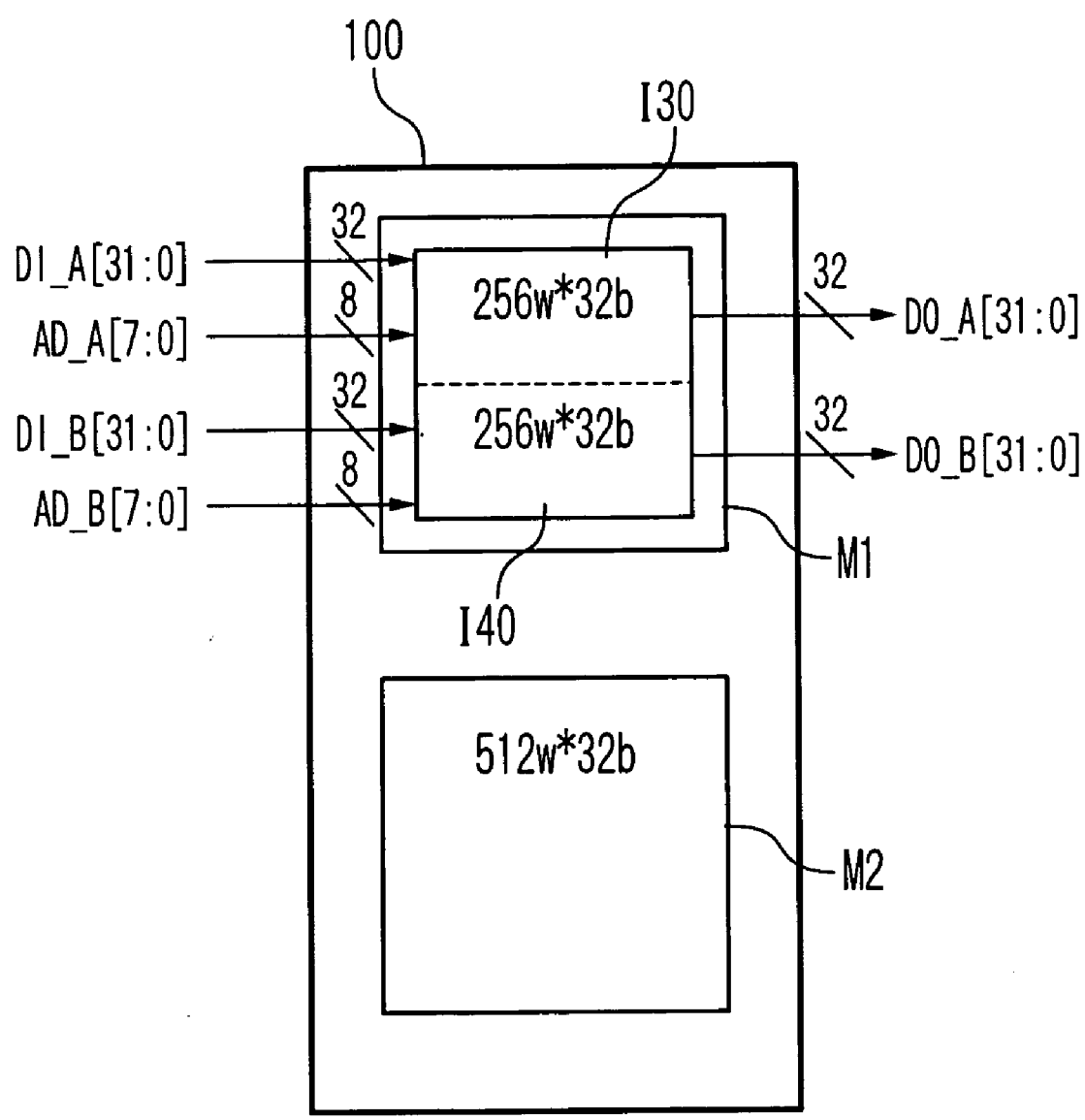
FIG. 9 is a conceptual view showing an exemplary memory assignment in which two instances are assigned to one memory macro by the integrated circuit design apparatus in the first embodiment of the present invention.

FIG. 9 is a conceptual view showing an exemplary configuration of the memory macros M1 and M2 integrated within the memory macro arrangement region 100. In the second embodiment, two memory instances 130 and 140 each having a memory size of 256 W*32 b are assigned to the memory macro M1. The memory macros M1 and M2 each incorporate a memory cell array of a memory size of 512 w*32 b. 256 word lines (256 w) corresponding to the upper half of the memory cell array are assigned to the memory instance I30, while the remaining 256 word lines (256 w) corresponding to the lower half of the memory cell array are assigned to the memory instance I40.

A description is given of the memory instances 130 and 140 assigned to the memory macro M1 in the following. The memory instance 130 receives the data signals DI_A [31:0] and the address signals AD_A [7:0]; which are selected by the input control circuit 104. The received data signals DI_A [31:0] are fed to the data input lines DI [31:0] of the memory macro M1 and written to the address specified by the address signals AD_A [7:0]. Also, the data signals DO_A [31:0] are read from the address specified by the address signals AD_A [7:0].

On the other hand, the memory instance I40 receives the data signals DI_B [31:0] and the address signals AD_B [7:0], which are selected by the input control circuit 104. The data signals DI_B [31:0] are fed to the data input lines DI [31:0] of the memory macro M1 and written to the address specified by the address signals AD_B [7:0]. Also, the data signals DO_B [31:0] are read from the address specified by the address signals AD_B [7:0].

In the second embodiment, the data signals DI_A [31:0], the address signals AD_A [8:0], the data signals DI_B [31:0] and the address signals AD_B [8:0] are selectively fed to the memory macro M1 by the input control circuit 104. Therefore, the data signals DI_A [31:0] and data signals DI_B [31:0] are selectively written into the memory macro M1. Also, the data signals DO_A [15:0] and data signals DO_B [15:0], which are outputted from the memory macro M1, are selectively outputted to an external apparatus (not shown) by the output control circuit 105.

Figure 10:
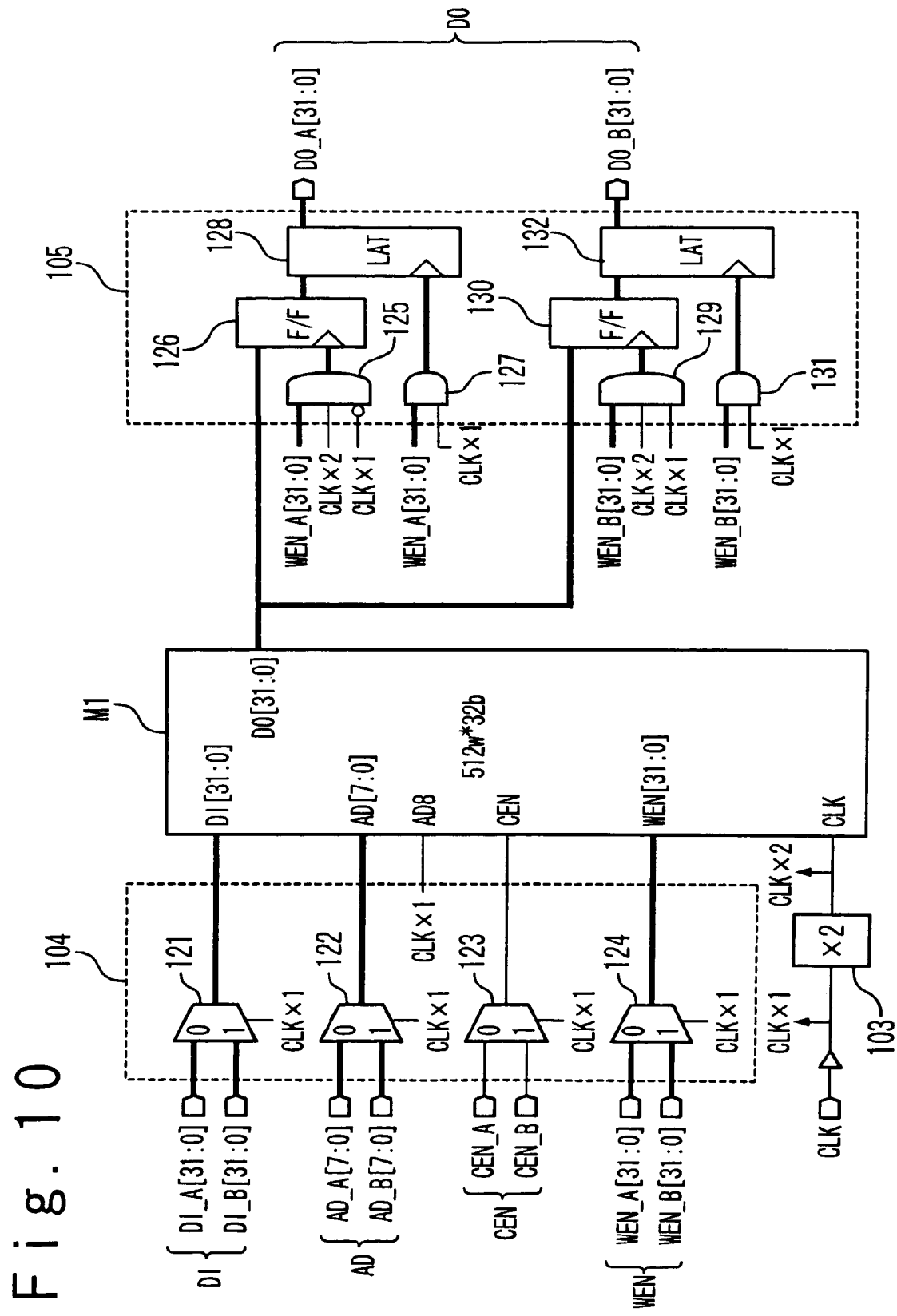
FIG. 10 is a block diagram illustrating exemplary configurations of a memory macro and a peripheral circuit macro designed by the semiconductor integrated circuit design apparatus of FIG. 3 in a second embodiment of the present invention.

As thus described, two memory instances I30 and 140 are assigned to one memory macro M1 in this embodiment. FIG. 10 is a block diagram showing the detail of the configuration of the memory macro M1 and the peripheral circuit macros (the frequency multiplier 103, the input control circuit 104 and the output control circuit 105) in the second embodiment. In the following, detailed description is given of the configuration of the memory macro M1 and the peripheral circuit macros in the second embodiment.

The input control circuit 104 includes selectors 121, 122, 123 and 124. The data signals DI include the data signals DI_A [31:0] and the data signals DI_B [31:0], which are fed to the data input lines DI [31:0] through the selector 121. The address signals AD include the address signals AD_A [7:0] and the address signals AD_B [7:0], which are fed to the address signal lines AD [7:0] through the selector 122. The chip selection signals CEN include the chip selection signal CEN_A and the chip selection signal CEN_B, which are fed to the chip selection signal line CEN through the selector 123. The write enable signals WEN include the write enable signals WEN_A [31:0] and the write enable signals WEN_B [31:0], which are inputted to the write enable signal lines WEN [31:0] through the selector 124.

The selector 121 selects the data signals DI_A [31:0] and the data signals DI_B [31:0] in response to the clock signal CLKx1 and outputs the selected set of the data signals to the data input lines DI [31:0] in the memory macro M1. In detail, the selector 121 selects the data signals DI_B [31:0] in response to the pull-up of the clock signal CLKx1 and selects the data signals DI_A [31:0] in response to the pull-down of the clock signal CLKx1.

The selector 122 selects the address signals AD_A [7:0] and the address signals AD_B [7:0] in response to the clock signal CLKx1 and outputs the selected set of the address signals to the address signal lines AD [7:0] in the memory macro M1. In detail, the selector 122 selects the address signals AD_B [7:0] in response to the pull-up of the clock signal CLKx1 and selects the address signals AD_A [7:0] in response to the pull-down of the clock signal CLKx1.

The selector 123 selects one of the chip selector signal CEN_A for selecting the memory instance I30 and the chip selector signal CEN_B for selecting the memory instance I40 in response to the clock signal CLKx1 and outputs the selected one to the chip selection signal line CEN in the memory macro M1. In detail, the selector 123 selects the chip selector signal CEN_B in response to the pull-up of the clock signal CLKx1 and selects the chip selection signal CEN_A in response to the pull-down of the clock signal CLKx1.

The selector 124 selects the write enable signals WEN_A [31:0] and the write enable signals WEN_B [31:0] in response to the clock signal CLKx1 and outputs the selected set of the write enable signals to the write enable signal lines WEN [31:0] in the memory macro M1. It should be noted that the write enable signals WEN_A [31:0] are used for selecting the memory instance I30, and the write enable signals WEN_B [31:0] are used for selecting the memory instance I40. In detail, the selector 124 selects the write enable signals WEN_B [31:0] in response to the pull-up of the clock signal CLKx1 and selects the write enable signals WEN_A [31:0] in response to the pull-down of the clock signal CLKx1.

The frequency multiplier 103 feed the clock signal CLKx2 generated through frequency doubling of the clock signal CLKx1 to the clock input CLK of the memory macro M1. In addition, the clock signal CLKx1 is fed to the address signal line AD8, which is used to indicate the MSB (most significant bit) of the address of the memory macro M1. This allows alternately selecting 256 word lines corresponding to the upper half of the memory macro M1 and the remaining 256 word lines corresponding to the lower half of the memory macro M1, in synchronization with the clock signal CLKx1.

The output control circuit 105 contains AND circuits 125, 127, 129 and 131 and flip-flop circuits (F/F) 126, 130 and latch circuits 128, 138.

The AND circuit 125 generates output signals indicative of the logical ANDs of the write enable signals WEN_A [31:0], the inversion signal of the clock signal CLKx1 and the clock signal CLKx2, and feed the generated output signals to the F/F 126. The F/F 126 has data inputs connected to the data output lines DO [31:0] in the memory macro M1 and clock inputs connected to the outputs of the AND circuits 125. The F/F 126 outputs the data signals received from the data output lines DO [31:0] to the latch circuit 128 in response to the output signals from the AND circuit 115. That is, the F/F 126 receives the data signals DO_A [31:0] from the data output lines DO [31:0] in synchronization with the inversion signal of the clock signal CLKx1 and outputs the received data signals DO_A [31:0] to the latch circuit 128.

The AND circuit 127 generates output signals indicative of the logical ANDs of the write enable signals WEN_A [31:0] and the clock signal CLKx1, and feed the generated output signals to the latch circuit 128. The latch circuit 128 has data inputs connected to the outputs of the F/F 126 and clock inputs connected to the AND circuit 127. The latch circuit 128 latches the data signals DO_A [31:0] from the F/F 126 in response to the output signals from the AND circuit 127. In order to surely latch the data from the F/F 126, the delay circuit may be inserted between the AND circuit 127 and the latch circuit 128.

The AND circuit 129 generates output signals indicative of the logical ANDs of the write enable signals WEN_A [31:0], the clock signal CLKx1 and the clock signal CLKx2, and feeds the generated output signals to the F/F 130. The F/F 130 has data inputs connected to the data output lines DO [31:0] in the memory macro M1 and clock inputs connected to the outputs of the AND circuit 129. The F/F 130 outputs the data signals received from the data output lines DO [31:0] to the latch circuit 132 in response to the outputs from the AND circuit 129. That is, the F/F 130 receives the data signals DO_B [31:0] from the data output lines DO [31:0] in synchronization with the clock signal CLKx1 and forwards the received data signals DO_B [31:0] to the latch circuit 132.

The AND circuit 131 generates output signals indicative of the logical ANDs of the write enable signals WEN_B [31:0] and the clock signal CLKx1, and feeds the generated output signals to the latch circuit 132. The latch circuit 132 has data inputs connected to the F/F 130 and clock inputs connected to the output of the AND circuit 131. The latch circuit 132 latches the data signals DO_B [31:0] from the F/F 130 in response to the output signals from the AND circuit 131. In order to surely latch the data from the F/F 130, a delay circuit may be inserted between the AND circuit 131 and the latch circuit 132.

As described above, the memory instances I30 and I40 commonly use the data input lines DI [31:0] and the data output lines DO [31:0] to write and read the data. In detail, the memory instance I30 is associated with 256 word lines in the upper half of the memory macro M1. Write data to be written into the memory instance I30 are fed to the data input lines DI [31:0] and written into the memory region associated with the 256 word lines in the upper half. In addition, and read data are read from 256 word lines in the lower half of the memory macro M1, and externally outputted from the data output lines DO [31:0]. On the other hands, the memory instance I40 is associated with 256 word lines in the lower half of the memory macro M1. Write data to be written into the memory instance I40 are fed to the data input lines DI [31:0] and written into the memory region associated with the 256 word lines in the lower half. In addition, and read data are read from 256 word lines in the lower half of the memory macro M1, and externally outputted from the data output lines DO [31:0]. The address switching is achieved by feeding the clock signal CLKx1 to the address line AD8, which is associated with the MSB of the address. The data write and read into and from the memory macro M1 are executed in synchronization with the frequency-multiplied clock signal CLKx2.

In the write operation, the data signals DI are alternately written to the memory instances I30 and I40 integrated within the memory macro M1 in synchronization with the frequency-multiplied clock signal CLKx2. Also, the data read from the memory instances I30 and I40 in synchronization with the frequency-multiplied clock signal CLKx2 are alternately outputted from the output control circuit 105 in synchronization with the clock signal CLKx1. In the following, a detailed description is given of operations of the memory macro M1 and peripheral circuit macros shown in FIG. 10 with reference to FIGS. 11 and 12.

Figure 11:
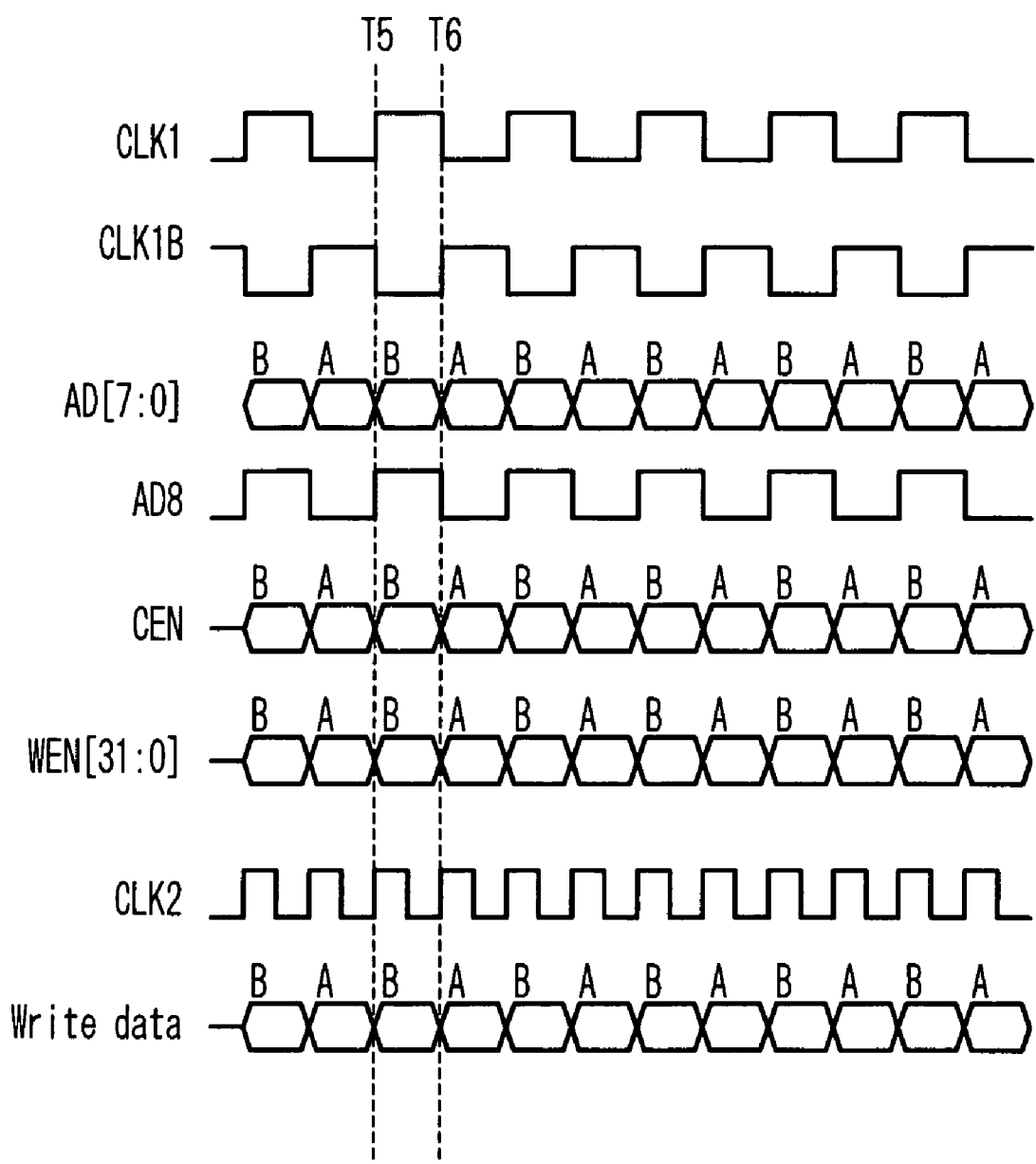
FIG. 11 is a timing chart showing an exemplary write operation of the memory macro and the peripheral circuit macro in the second embodiment.

FIG. 11 is a timing chart showing an exemplary write operation into the memory macro M1 in the second embodiment. In the example shown in FIG. 11, the clock signal CLKx1 is pulled up at the time T5 and pulled down at the time T6.

At the time T5, 256 word lines in the lower half of the memory macro M1 are allowed to be activated in response to the pull-up of the clock signal CLKx1, which is fed to the address signal line AD8. In addition, the chip selection signal CEN_B, the address signals AD_B [7:0] and the data signals DI_B [31:0] are fed to the memory macro M1 in response to the pull-up of the clock signal CLKx1. This allows selecting a desired address of the memory instance I40. Moreover, the memory instance I40 is set writable in response to the write enable signals WEN_B [31:0] fed to the write enable signal lines WEN [31:0].

At the time T6, 256 word lines in the upper half of the memory macro M1 are allowed to be activated in response to the pull-down of the clock signal CLKx1, which is fed to the address signal line AD8. In addition, the chip selection signal CEN_A, the address signals AD_A [7:0] and the data signals DI_A [31:0] are fed to the memory macro M1 in response to the pull-down of the clock signal CLKx1. This allows selecting a desired address of the memory instance I30. Moreover, the memory instance I30 is set writable in response to the write enable signals WEN_A [31:0] fed to the write enable signal lines WEN [31:0].

The data signals DI fed to the data input lines DI [31:0] in synchronization with the frequency-multiplied clock signal CLKx2 are written into the memory macro M1. Here, the data signals DI_B [31:0] fed to the data input lines DI [31:0] in synchronization with the pull-up of the clock signal CLKx2 are written into the memory instance I40 at the time T5. Also, the data signals DI_A [31:0] fed to the data input lines DI [31:0] in response to the pull-down of the clock signal CLKx2 are written to the memory instance I30 at the time T6.

Figure 12:
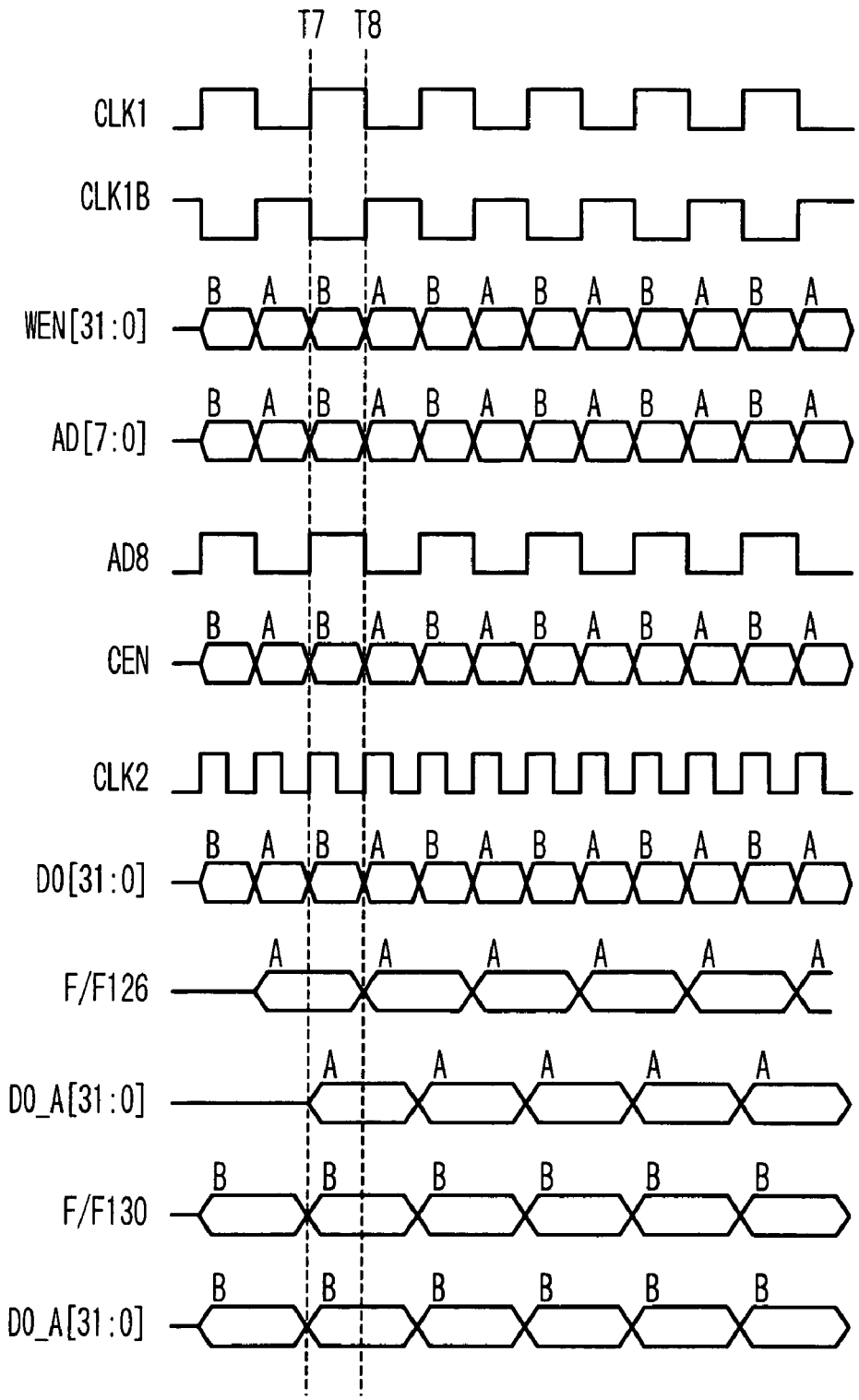
FIG. 12 is a timing chart showing an exemplary read operation of the memory macro and the peripheral circuit macro in the second embodiment.

FIG. 12 is a timing chart showing an exemplary read operation from the memory macro M1. In the example of FIG. 12, the clock signal CLKx1 is pulled up at the time T7 and pulled down at the time T8.

At the time T7, 256 word lines in the lower half of the memory macro M1 are allowed to be activated in response to the pull-up of the clock signal CLKx1 fed to the address signal line AD8. In addition, the chip selection signal CEN_B, the address signals AD_B [7:0] and the data signals DI_B [31:0] are fed to the memory macro M1 in response to the pull up of the clock signal CLKx1. This allows selecting a desired address of the memory instance I40. Moreover, the memory instance I40 is set readable by the write enable signals WEN_B [31:0] fed to the write enable signal lines WEN [31:0].

At the time T8, 256 word lines of the lower half of the memory macro M1 are allowed to be activated in response to the pull-down of the clock signal CLKx1 fed to the address signal line AD8. In addition, the chip selection signal CEN_A, the address signals AD_A [7:0] and the data signals DI_A [31:0] are fed to the memory macro M1 in response to the pull-down of the clock signal CLKx1. As a result, a desired address of the memory instance I30 is selected.

Moreover, the selected address of the memory instance I30 is set readable by the write enable signals WEN_A [31:0] fed to the write enable signal lines WEN [31:0].

The data signals are read from the data output signal lines DO [31:0] of the memory macro M1 in synchronization with the multiplied clock signal CLKx2. Here, the data stored in the memory instance I40 (that is, the data signals DO_B [15:0]) are outputted in synchronization with the pull-up of the clock signal CLKx2 (at the time T7). On the other hand, the data stored the memory instance I30 (that is, the data signals DO_A [15:0]) are outputted in response to the pull-down of the clock signal CLKx2 at the time T8.

At the time T7, the F/F 130 receives the data signals DO_B [31:0] from the data output lines DO [31:0] in synchronization with the pull-up of the clock signal CLKx1 and outputs the received data signals DO_B [31:0] to the latch circuit 132. The latch circuit 132 latches the data signals DO_B [31:0] outputted from the F/F 130 in synchronization with the pull-up of the clock signal CLKx1 and externally outputs the latched data signals DO_B [31:0] to an external apparatus (not shown). Also, at the time T8, the F/F 126 receives the data signals DO_B [31:0] from the data output lines DO [31:0] in synchronization with the pull-down of the clock signal CLKx1 and outputs the received data signals DO_B [31:0] to the latch circuit 128. The latch circuit 128 latches the data signals DO_B [31:0] from the F/F 126 in synchronization with the pull-down of the clock signal CLKx1, and externally outputs the latched data signals DO_B [31:0] to the external apparatus (not shown).

As described above, the read data alternately read from the memory instances I30 and I40 in synchronization with the clock signal CLKx2 are externally outputted from the output control circuit 105 to the external apparatus (not shown) in synchronization with the clock signal CLKx1.

In summary, the integrated circuit design technique of the above-described embodiments of to the present invention allows assigning multiple instances (two instances, for example) to one memory macro in the case when the instances operate on a common clock signal, through feeding a frequency-multiplied clock signal generated by frequency-multiplication (or frequency doubling) to the relevant inductances (or the associated memory macro), and controlling the inputs and outputs of the data signals and address signals by using the input control circuit 104 and the output control circuit 105. This allows efficiently using the memory macro arrangement region 100 and the memory macros incorporated therein.

In the conventional technique, for example, two memory instances I10 and I20 are assigned to two memory macros M1 and M2 as shown in FIG. 1; three or more instances could not be assigned in this case. Additionally, only half of the total memory capacity of the memory macros M1 and M2 are effectively used; the memory region of 512 w*32 b wastefully remains unused as the memory was wasteful.

As shown in FIGS. 5 and 9, on the other hand, two memory instances I10 and I20 (or memory instances I30 and I40) are assigned to one memory macro M1 in the semiconductor integrated circuit 1 according to the present invention; no instance is assigned to the memory macro M2. This allows incorporating an additional instance if necessary. In addition, the memory assignment of the present invention, which assigns multiple instances to one memory macro, allows efficient use of the memory region while resolving the lack of the number of memory macros.

It is apparent that the present invention is not limited to the above embodiments, but may be modified and changed without departing from the scope of the invention.

What is claimed is:

1. An integrated circuit design method for assigning memory instances to memory macros integrated within an integrated circuit, said method comprising:
    assigning a plurality of memory instances operating at a same operation frequency to a single memory macro;
    arranging a frequency multiplier which receives a first clock signal to generate a second clock signal through a frequency multiplication of said first clock signal, and feeds said second clock signal to said plurality of memory instances; and
    arranging a control circuit which selects said plurality of memory instances in synchronization with said first clock signal.

2. The integrated circuit design method according to claim 1, wherein said assigning comprises providing a common address line for said plurality of memory instances, and
    wherein said control circuit includes an input control circuit which selects address signals associated with said plurality of memory instances, respectively, in synchronization with said first clock signal to feed the selected address signals to said address signal line.

3. The integrated circuit design method according to claim 2, wherein said plurality of memory instances includes a first memory instance and a second memory instance, and
    wherein said assigning includes:
        assigning data signal lines of upper bits of said single memory macro to said first memory instance; and
        assigning data signal lines of lower bits of said single memory macro to said second memory instance.

4. The integrated circuit design method according to claim 2, wherein said plurality of memory instances include a first memory instance and a second memory instance, and
   wherein said assigning includes:
      assigning word lines of an upper half of said single memory macro to said first memory instance; and
      assigning word lines of an upper half of said single memory macro to said second memory instance.

5. The integrated circuit design method according to claim 1, wherein said control circuit comprises an output control circuit reading data signals from said plurality of memory instances in synchronization with said first clock signal.

6. A tangible computer-readable recording medium which records a program that when executed controls a computer to perform a method, said method comprising:
   assigning a plurality of memory instances operating at a same operation frequency to a single memory macro;
   arranging a frequency multiplier which receives a first clock signal to generate a second clock signal through a frequency multiplication of said first clock signal, and feeds said second clock signal to said plurality of memory instances; and
   arranging a control circuit which selects said plurality of memory instances in synchronization with said first clock signal.

7. A semiconductor integrated circuit, comprising:
   a memory having a plurality of memory regions corresponding to a plurality of instances, respectively;
   a frequency multiplier receiving a first clock signal to generate a second clock signal through a frequency multiplication of said first clock signal, and feeding said second clock signal to said plurality of memory instances; and
   a control circuit which selects said plurality of memory instances in synchronization with said first clock signal.

8. The semiconductor integrated circuit according to claim 7, wherein said plurality of memory regions are connected to a common address line, and
   wherein said control circuit includes an input control circuit which selects address signals associated with said plurality of memory instances, respectively, in synchronization with said first clock signal to feed the selected address signals to said address signal line.

9. The semiconductor integrated circuit according to claim 8, wherein said plurality of memory regions include first and second memory regions, and
   wherein said first memory region is connected to data signal lines of upper bits of a memory macro, and
   wherein said second memory region is connected to data signal lines of lower bits of said memory macro.

10. The semiconductor integrated circuit according to claim 8, wherein said plurality of memory regions include first and second memory regions, and
   wherein said first memory region incorporates word lines of an upper half of a memory macro, and
   wherein said second memory region incorporates word lines of a lower half of said memory macro.

11. The semiconductor integrated circuit according to claim 7, wherein said control circuit comprises an output control circuit reading data signals from said plurality of memory instances in synchronization with said first clock signal.

12. The semiconductor integrated circuit according to claim 7, wherein at least one of the plurality of instances is assigned to a first memory macro, and
   wherein the first memory macro performs data write, data read, and data erase operations in synchronization with the second clock signal.

13. The semiconductor integrated circuit according to claim 12, wherein said control circuit comprises an output control circuit, and
   wherein said output circuit reads data from the first memory macro in synchronization with the second clock signal and externally outputs the read data in synchronization with the first clock signal.

14. The semiconductor integrated circuit according to claim 12, wherein the output control circuit comprises a first latch circuit configured to latch a first data signal.

15. The semiconductor integrated circuit according to claim 12, wherein said control circuit comprises an input control circuit, the input control circuit selectively providing data signals, address signals, command signals, and chip selection signals to respective memory instances of the plurality of memory instances.

* * * * *